United States Patent
Uemura

(10) Patent No.: US 6,649,941 B2
(45) Date of Patent: Nov. 18, 2003

(54) METHOD FOR MANUFACTURING SEMICONDUCTOR DEVICE USING GROUP III NITRIDE COMPOUND

(75) Inventor: Toshiya Uemura, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 09/977,939

(22) Filed: Oct. 17, 2001

(65) Prior Publication Data

US 2002/0017727 A1 Feb. 14, 2002

Related U.S. Application Data

(62) Division of application No. 09/468,638, filed on Dec. 22, 1999, now Pat. No. 6,331,450.

(30) Foreign Application Priority Data

Dec. 22, 1998 (JP) ............................................. 10-364965

(51) Int. Cl.$^7$ ................................................. H01L 29/24
(52) U.S. Cl. ....................... 257/100; 257/615; 257/778; 257/787; 438/114; 438/127
(58) Field of Search .................................. 257/100, 103, 257/615, 778, 787; 438/114, 127

(56) References Cited

U.S. PATENT DOCUMENTS

| | | | |
|---|---|---|---|
| 4,316,208 A | 2/1982 | Kobayashi et al. ........... 357/55 |
| 5,897,337 A | 4/1999 | Kata et al. ................... 438/114 |
| 5,975,408 A | 11/1999 | Goossen ................... 228/173.2 |
| 6,037,191 A | 3/2000 | Honda et al. ................ 438/114 |
| 6,121,689 A | 9/2000 | Capote et al. .............. 257/783 |
| 6,132,646 A | 10/2000 | Zhou et al. .................. 252/512 |
| 6,331,450 B1 * | 12/2001 | Uemura ....................... 438/114 |
| 6,333,522 B1 * | 12/2001 | Inoue et al. ................... 257/99 |
| 6,343,171 B1 * | 1/2002 | Yoshimura et al. ........... 385/50 |
| 6,476,501 B1 * | 11/2002 | Ohuchi et al. ............... 257/778 |

OTHER PUBLICATIONS

Wierer et al., High–power AlgalnN flip–chip light–emitting diodes, Appl. Phys. Lett., 78 (2001) 3379.*

* cited by examiner

Primary Examiner—Richard Elms
Assistant Examiner—Christian D. Wilson
(74) Attorney, Agent, or Firm—McGinn & Gibb, PLLC

(57) ABSTRACT

A flip-chip-type device is formed from a plurality of flip-chip semiconductor device units integrated together on a common substrate having a Group III nitride compound semiconductor layer. A sealing resin is laminated on a surface of the common substrate cured, and the substrate is then divided into individual sealed flip-chip semiconductor devices. Because the positive and negative electrodes are formed on the same side of the devices, the sealing resin need only be applied to the side of the substrate on which the electrodes are formed. Metal pillars may be formed on the electrodes and extend through the cured resin to electrically connect the flip-type semiconductor device to an external source and produce a self-contained package.

11 Claims, 6 Drawing Sheets

METHOD FOR MANUFACTURING SEMICONDUCTOR DEVICE USING GROUP III NITRIDE COMPOUND

This application is a divisional application of U.S. Ser. No. 09/468,638, filed Dec. 22, 1999 now U.S. Pat. No. 6,331,450. Priority is claimed based on Japanese Patent Application No. H10-364965 filed in Japan on Dec. 22, 1998, the complete disclosure of which is incorporated herein by reference.

BACKGROUND OF THE INVENTION

1. Field of the Invention

This invention is directed to a method of manufacturing a sealed device having a Group III nitride compound semiconductor and connectable to an external source. More particularly, the invention is directed to a method of manufacturing a sealed flip-chip-type device and a sealed wire-bonding-type device not to be required separate sealing steps and to constitute a self-contained package which is electrically connectable to an external source.

2. Description of the Related Art

Flip-chip-type devices and wire-bonding-type devices containing Group III nitride compounds as semiconductors are known in the art. An example of such a flip-chip-type device is shown in FIG. 6A, in which the flip-chip-type device is designated by reference numeral 100.

Referring to FIG. 6A, a plurality of flip-chip-type device units 100 are integrated by a common Group III nitride compound semiconductor substrate 10 carrying a plurality of positive electrodes 11 and negative electrodes 12. As shown in FIG. 6A, during manufacturing the Group III nitride compound semiconductor substrate 10 is divided by an appropriate technique into a plurality of flip-chip-type devices 100, each of which comprises a segment of the Group III nitride compound semiconductor substrate 10, one of the positive electrodes 11, and one of the negative electrodes 12.

The flip-chip-type device 100 is then connected to an external member (or source) 6 and sealed by known techniques. Two examples of known techniques for making this connection are respectively shown in FIGS. 6B and 6C, in which the flip-chip-type device 100 is shown in an inverted position and connected to the external member 6.

According to first conventional technique depicted in FIG. 6B, the connection between the device 100 and the external member 6 is accomplished by forming bumps 1 on the external member (or frame) 6. One of the bumps 1 connects the positive electrode 11 to a first electrode of the external member 6, and the other of the bumps 1 connects the negative electrode 12 of the flip-chip-type device 100 to the second electrode of the external member 6. These bumps 1 comprise a gold ball or solder. After this connection is made, the flip-chip-type device 100 and a surface portion of the external member 6 are encased or sealed with a resin 3.

According to the second conventional technique depicted in FIG. 6C, first and second electrodes 21 and 22 of an internal member (or subframe) 20 patterned on the internal member 20 are connected respectively to the positive electrode 11 and the negative electrode 12 of the flip-chip-type device 100. Bumps 1 serve as electrical connection bridges for electrically connecting the first electrode 21 to the positive electrode 11 and the second electrode 22 to the negative electrode 12. Then, the internal frame 20 is attached to the external member (or frame) 6 via a conductive adhesive 4 and the electrode 21 is connected to a wire bonding 5. The device 100, the internal member 20, the conductive adhesive 4, the wire bonding 5, and a portion of the external member 6 are sealed together by the resin 3.

In each of the conventional techniques illustrated in FIGS. 6A and 6B, the resin 3, which is laminated after the flip-chip-type device 100 has been connected to the external member 6, leaves an empty gap 33 either between the device 100 and the external member 6 (in the first conventional technique of FIG. 6B) or between the device 100 and the internal frame 20 (in the second conventional technique of FIG. 6C). In order to prevent the gap 33 from forming, a specific resin, i.e., an underfill material, is used to fill the gap 33 area prior to sealing the entire surface of the device 100. The underfill material means that the resin has a low viscosity and a high fluidity.

The need to practice this additional filling step to prevent the formation of gaps 33 inherently obtained by these conventional techniques increases the costs of manufacture by increasing processing time. It would be a significant improvement in the art to provide a process in which the manufacturing efficiency is increased by avoiding the need for this filling step and avoiding the need for separate inspection checks to inspect, on an individual basis, the adequacy of the seal of each of the separate devices 100.

And with respect to the wire-bonding-type light-emitting device, sealing step by resin is carried out after separating the device into each chips.

SUMMARY OF THE INVENTION

It is, therefore, an object of this invention to improve the productivity and efficiency of a semiconductor device manufacturing process for a sealed flip-chip-type device and a wire-bonding-type device having a Group III nitride compound semiconductor by avoiding the need for a separate sealing step.

Another object of this invention is to simplify quality assurance checks by consolidating the need for separately inspecting the sealing resin laminated on the sealed flip-chip-type device and the wire-bonding-type device into a single inspection process, in which the sealing resin of the devices is inspected while the devices share a common substrate.

In accordance with an embodiment of this invention, these and other objects are achieved by a method for manufacturing a sealed flip-chip-type device and a wirebonding type device. According to an embodiment of this method, a plurality of semiconductor device units integrated together on a common substrate having a Group III nitride compound semiconductor layer is provided. Each of the semiconductor device units comprises a positive electrode and a negative electrode. A curable sealing resin is laminated on a surface of the common substrate on which electrodes are formed so as to at least partially seal the electrodes. Then, the resin is cured. Thereafter, the common substrate having the cured sealing resin is divided into a plurality of individual semiconductor devices, with each of the semiconductor devices comprising a segment of the substrate and at least one positive electrode and at least one negative electrode. Because the positive and negative electrodes are commonly formed on the same side of the Group III nitride compound layer, the sealing resin need only be laminated and cured on one side of the Group III nitride compound layer, i.e., on the side on which the electrodes are formed. The opposite side (without the electrodes) of the Group III nitride compound layer does not require lamination with the sealing resin, since Group III nitride compound layers generally are characterized by high stability and durability.

In accordance with one modification to this embodiment, metal pillars or bonding pads are formed (for example, by plating) on the surface of the electrodes of the flip-chip-type device units and the wire-bonding units prior to laminating and curing the resin. The metal pillars or bonding pads are thereafter generally surrounded by the cured resin, except at an exposed portion, at which the metal pillars or bonding pads are electrically connectable to an external member. Because the external member is not connected to the device at the time of resin lamination and curing, the external member does not obstruct the lamination step and, as a consequence, air gaps formed between the sealed flip-chip-type device and the external or internal member is eliminated.

In accordance with another embodiment of this invention, a method is provided for manufacturing a plurality of sealed semiconductor devices and thereafter individually connecting the semiconductor devices to respective external sources. According to this method, there is provided a plurality of semiconductor device units integrated together on a common substrate having a Group III nitride compound semiconductor layer, each of the semiconductor device units comprising a positive electrode and a negative electrode. First and second metal pillars are formed on the positive and negative electrodes, respectively, then a curable sealing resin is laminated on the surface of the common substrate on which electrodes and metal pillars are formed so as to seal the positive and negative electrodes and metal pillars, except for leaving electrical connection portions of the first and second metal pillars exposed. The sealing resin is then cured. Next, the common substrate and the cured sealing resin are divided into a plurality of individual sealed flip-chip semiconductor devices, which can thereafter be electrically connected with an external member or internal member at the exposed electrical connection portions.

One advantage of this invention is that a plurality of semiconductor devices can be simultaneously sealed and inspected together while sharing a common substrate. This differs from the conventional techniques, in which the common substrate is divided into individual semiconductor devices, which are then individually connected to external sources and sealed, thus requiring separate inspection of each of the individual sealed semiconductor devices. Because in this invention the semiconductor device units are sealed prior to dividing the common substrate into a plurality of individual semiconductor devices, the quality of the seal of each of the devices can be inspected together on the common substrate, thus consolidating the inspection process for the devices into one step. Accordingly, productivity in the manufacture of a plurality of the devices can be improved.

Additionally, the sealed device according to this method is a self-contained package, which is ready for sale soon after the dividing step. The device can, therefore, be sold separately from the external member or source, and thereafter mounted on the external member or source subsequent to sale. This feature is especially beneficial for devices used as light-emitting diodes (LED). In this manner, mass production of the device can be achieved.

Other objects, aspects and advantages of the invention will be apparent to those skilled in the art upon reading the specification and appended claims which, when read in conjunction with the accompanying drawings, explain the principles of this invention.

BRIEF DESCRIPTION OF THE DRAWINGS

The accompanying drawings, which constitute part of this specification, serve to elucidate the principles of this invention. In such drawings.

DETAILED DESCRIPTION OF THE PREFERRED EMBODIMENTS

The present invention will be described hereinbelow with reference to specific embodiments. These embodiments are not exclusive or exhaustive as to the scope of this invention.

EXAMPLE 1

Figure 1:
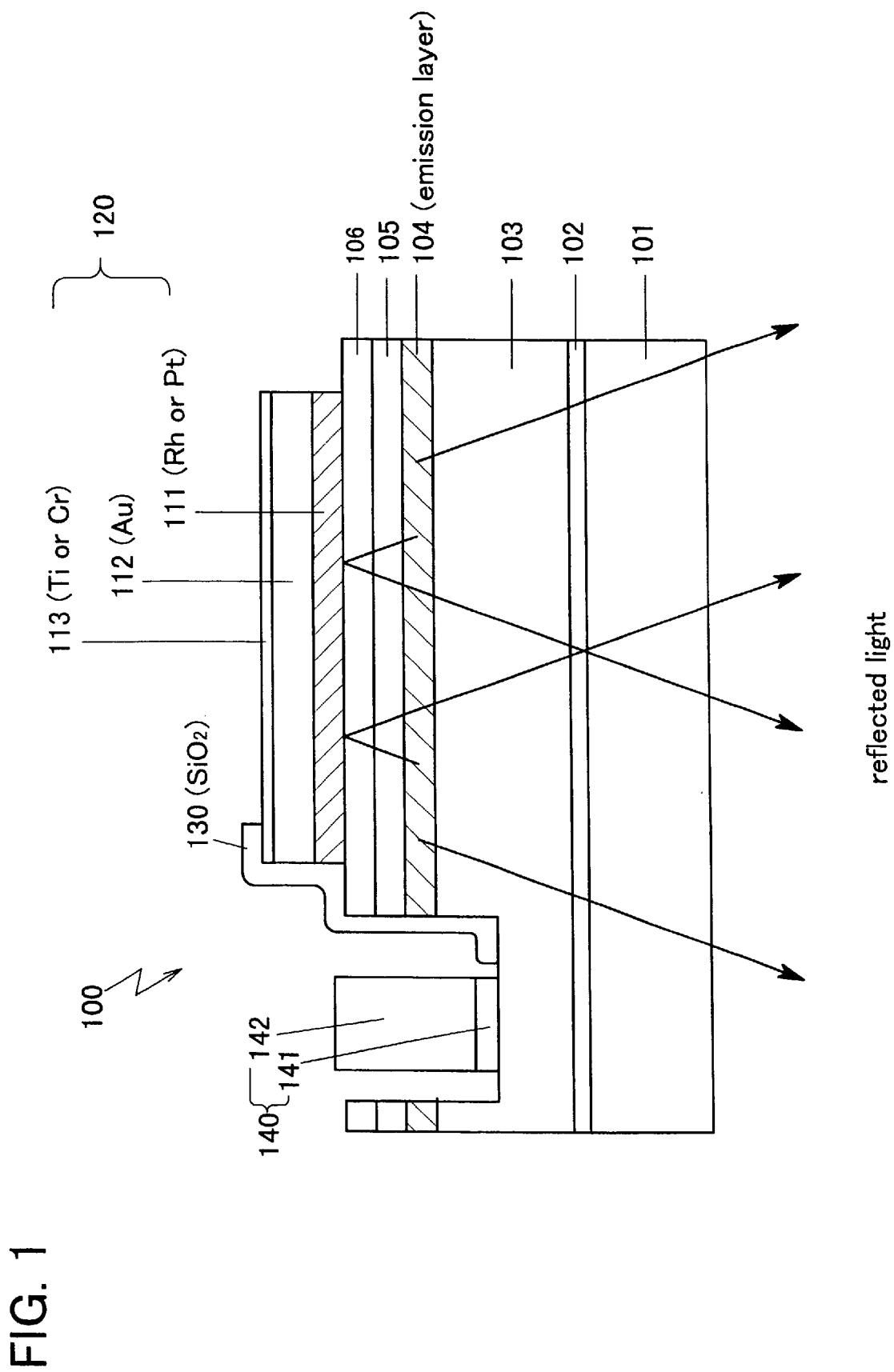
FIG. 1 is a sectional view of a flip-chip-type of light-emitting semiconductor device in accordance with a first embodiment of this invention.

FIG. 1 illustrates in sectional view a flip-chip-type (also referred to herein as a flip-chip) light-emitting device (LED), generally designated by reference numeral 100, suitable for use in the manufacturing process of this invention. It is to be understood, however, that the manufacturing process of this invention is not restricted to the formation of an LED. It is also to be understood that when the process is practiced with an LED as the Group III nitride semiconductor device, the process is not limited to the specific LED illustrated in the accompanying drawings.

The illustrated semiconductor device 100 comprises a sapphire substrate 101 having formed thereon a buffer layer 102 comprising aluminum nitride (AlN). In this embodiment, the buffer layer 102 has a thickness of about 200 Å. On the buffer layer 102 is disposed a silicon (Si) doped $n^+$-layer 103 comprising gallium nitride (GaN) and having a thickness of about 4.0 $\mu$m and a high carrier concentration successively thereon. Formed on the silicon-doped $n^+$-layer 103 is an emission layer 104 having a multi quantum-well structure (MQW) and comprising GaN and $Ga_{0.8}In_{0.2}N$. A magnesium (Mg)-doped p-layer 105 comprising $Al_{0.15}Ga_{0.85}N$ and having a thickness of about 600 Å is formed on the emission layer 104. A magnesium (Mg)-doped p-layer 106 comprising GaN and having a thickness of about 1500 Å is formed on the p-layer 105.

In the illustrated embodiment, the semiconductor device 100 includes a recess (unnumbered) formed in the upper surface thereof. The recess extends through the thickness of the magnesium-doped p-layers 105 and 106 and the emission layer 104, as well as through a portion of the thickness of the silicon-doped n+-layer 103. Disposed within the recess is a negative electrode, which is generally designated by reference numeral 140 and will be discussed in further detail hereinbelow.

A multi-layer thick film positive electrode, generally designated by reference numeral 120, is formed by depositing metal on a portion of the upper surface of the p-layer 106. The multi-layer thick film electrode 120 includes a first metal layer 111, a second metal layer 112, and a third metal layer 113. In the illustrated embodiment, these layers are stacked on one another with the third metal layer 113 located on top of the second metal layer 112, which is disposed over the first metal layer 111. The first metal layer is in turn disposed on the p-layer 106. The first metal layer 111 comprises rhodium (Rh), platinum (Pt), or an alloy thereof, and in accordance with this embodiment has a thickness of about 0.3 μm. The second metal layer 112 comprises gold (Au), and in accordance with this embodiment has a thickness of about 1.2 μm. The third metal layer 113 comprises titanium (Ti), and in this embodiment has a thickness of 30 Å.

The negative electrode 140 has a two-layer structure and is formed on an exposed portion of the n+-layer 103 of high carrier concentration. The two layers forming the negative electrode 140 are layer 141 comprising vanadium (V) and layer 142 comprising aluminum. In the illustrated embodiment, the layers 141 and 142 have thicknesses of about 175 Å and 1.8 μm, respectively.

A protective film 130 comprising $SiO_2$ extends from an end portion of the multi-layer thick film positive electrode 120, along a side wall of the recess in which the negative electrode 140 is disposed, and into proximity with the negative electrode 140. The protective film 130 thereby covers exposed portions of the semiconductor device 100. These exposed portions include portions of the n+-layer 103 located in the recess but not covered by the negative electrode 140, exposed sides of the emission layer 104 and the p-type layers 105 and 106 defining a portion of the recess, an exposed upper surface portion of the p-type layer 106, sides of the first, second, and third metal layers 111, 112, and 113, and an upper surface portion of the third metal layer 113. The thickness of the protective film 130 covering the upper surface of the third metal layer 113 is about 0.5 μm.

FIGS. 2A–2F illustrate process steps for sealing flip-chip-type light-emitting semiconductor device units with a curable sealing resin in accordance with an embodiment of this invention. As shown in FIGS. 2A–2F, this sealing technique is practiced before the common substrate 10 has been divided into individual and distinct devices 100.

Figure 2A:
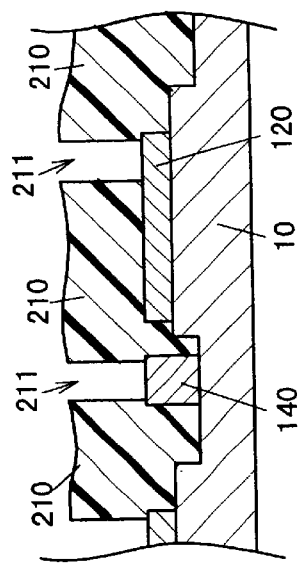
FIGS. 2A–2F are views sequentially showing the steps in which the flip-chip-type light-emitting semiconductor device units of the first embodiment are sealed with resin and divided into separate devices.
Figure 2B:
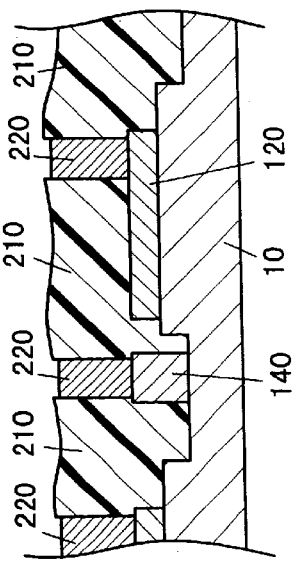
Figure 2C:
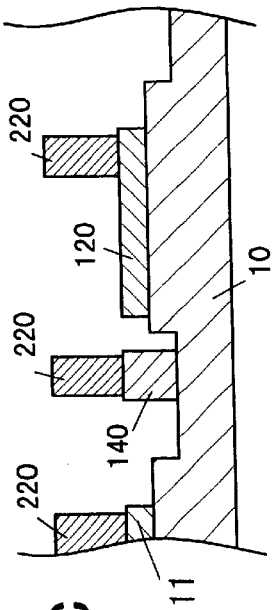
Figure 2D:
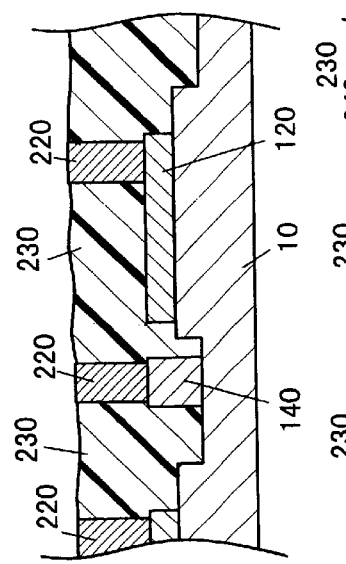
Figure 2E:
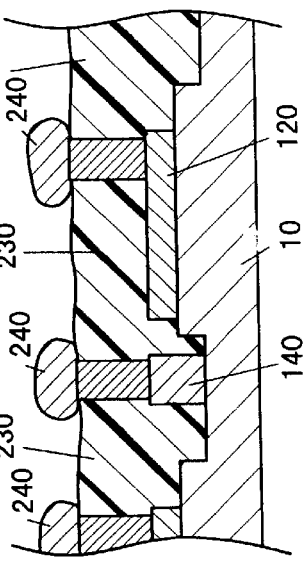
Figure 2F:
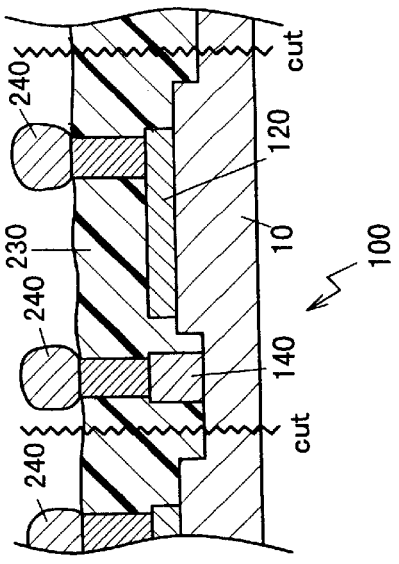

Referring to FIG. 2A, a thick film resist 210 is formed on the flip-chip-type device units, which are integrated at this stage in the process by means of the common substrate 10 shared by each of the flip-chip-type device units. (In FIGS. 2A–2F, only one of the units 100 is shown in full.) A plurality of plating-film-growth parts (or recesses) 211 are etched into the thick film resist 210 by a patterning technique, such as photolithography. As shown in FIG. 2B, plating films (or pillars) 220 comprising nickel and each having a thickness of about 100 μm are formed in respective ones of the plating film growth parts 211 by a suitable technique, such as electroless plating. Then, the thick film resist 210 is removed as shown in FIG. 2C, leaving the plating films 220 exposed. First removing the resist by using common organic solvent, and then the surface was cleaned by using special-purpose solvent for removing resin. Next, as shown in FIG. 2D, the flip-chip-type device units 100 carried on the common substrate 10 are collectively sealed with an epoxy resin 230, which is introduced onto the flip-chip-type device units 100 in a sufficient amount so that the resin 230 is at substantially the same height as (and flush with the top ends of) the plating films 220. As shown in FIGS. 2D and 2E, the top portions of the plating films are left exposed, so as to thereby provide exposed electrical connection portions. Solder bumps 240 are then formed on respective ones of the exposed electrical connection portions of the nickel plating films 220 by screen printing, as shown in FIG. 2E. The solder bump 240 may then be reshaped by softening (or reflowing) the solder bump 240 via heating, for example, in a furnace. The reshaped solder bumps 240 are shown in FIG. 2F. The flip-chip-type device units 100 are then separated from each other by dividing the substrate 10 into distinct pieces. The cutting is done by using a dicer.

Figure 6A:
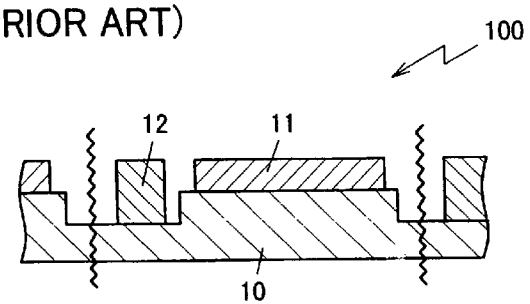
FIGS. 6A–6C are views depicting steps for sealing a flip-chip-type semiconductor device having a Group III nitride compound in accordance with conventional techniques.
Figure 6B:
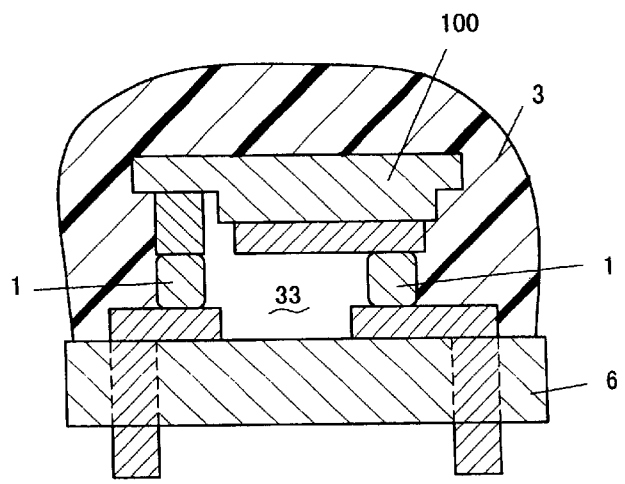
Figure 6C:
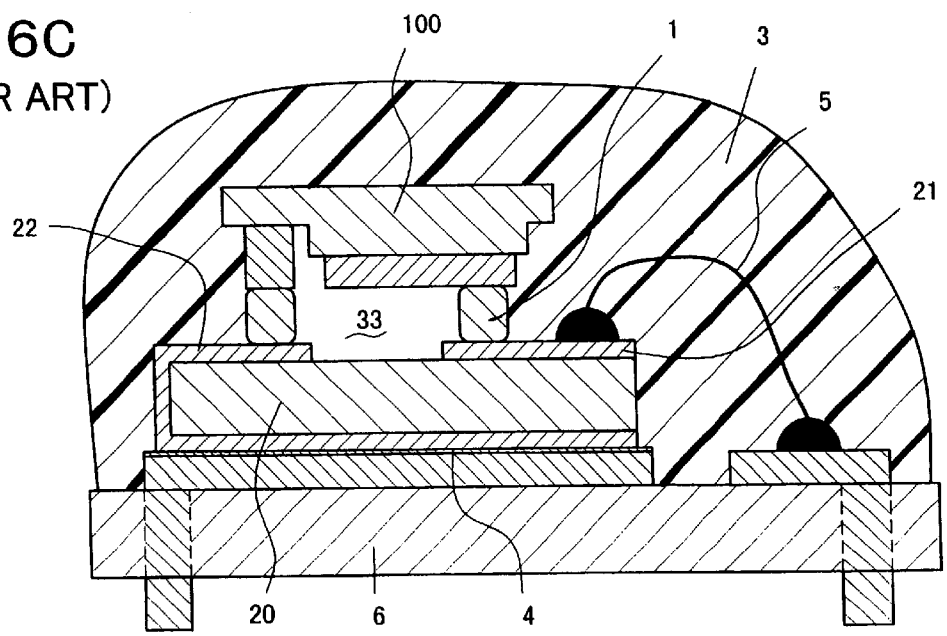

Because the flip-chip-type semiconductor device 100 is sealed with resin prior to being connected to an external member, the device 100 is sufficiently protected and has sufficient stability and durability to permit the device 100 to be sold and shipped as a unit apart from the external member. Additionally, sealing of the flip-chip-type device units 100 prior to dividing the substrate 10 into distinct pieces allows for the flip-chip-type device units 100 to all be inspected for sealing quality collectively, rather than on an individual basis as is required by the conventional techniques of FIGS. 6B and 6C. Accordingly, manufacturing efficiency and productivity can be increased.

It is to be understood that many modifications and variations can be practiced within the scope of this invention. For example, in the illustrated embodiment described above, the epoxy resin 230 seals one of the surfaces of the flip-chip-type device 100 up to the upper surfaces of the nickel plating films 220. Alternatively, the epoxy resin 230 may cover a portion or all of the surfaces of the nickel plating films 220 by practice of one or more of the following three techniques. First, the epoxy resin film 230 maybe laminated to a height greater than that of the nickel plating films 220, then removed from the upper surfaces of the nickel plating films 220 by washing. Second, an adhesive tape or the like (e.g., a protective film) may be formed on the upper surfaces of the nickel plating films 220 prior to lamination with the epoxy resin 230. Thereafter, both the adhesive tape and the epoxy resin can be removed from the upper surfaces of the nickel plating films 220 by peeling off the adhesive tape. Third, the epoxy resin film 230 may be removed from the upper surfaces of the nickel plating films 220 physically by pressure forming.

In the illustrated embodiment, the plating films 220 are made of nickel (Ni). Alternatively, the plating films 220 can be made of copper (Cu), gold (Au), silver (Ag), tin (Sn), or another conducting metal or alloy, or a combination or lamination thereof. The plating films 220 can be made of the same or different conductive materials. Also, in this embodiment, epoxy resin is used as the sealing resin. Other resins that can be used include, by way of example, polyester resin, polyimide resin, phenolic resin, polyurethane resin, silicone resin, and thermosetting resin. Additionally, as an alternative to the illustrated solder bump 240, wire bonding or the like can be used as the electrical connection between the plating films 220 and the external member.

EXAMPLE 2

Figure 3A:
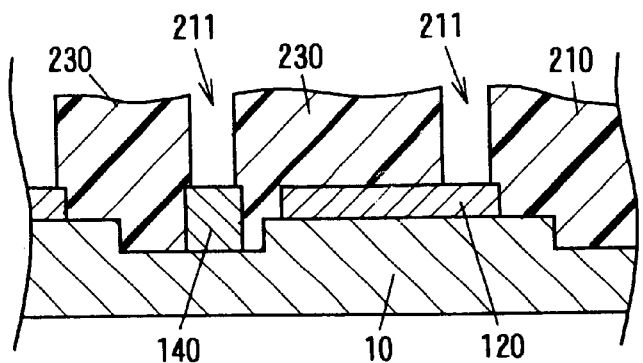
FIGS. 3A–3D are views sequentially showing the steps in which the flip-chip-type light-emitting semiconductor device units of the second embodiment are sealed with resin and divided into separate devices.
Figure 3B:
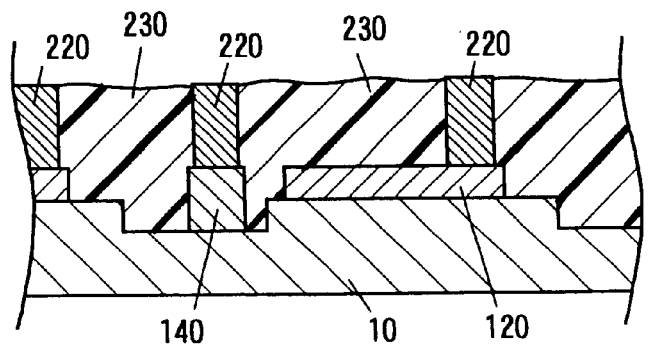
Figure 3C:
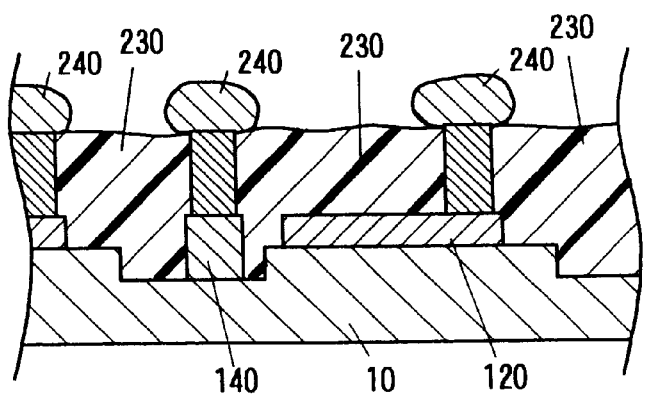
Figure 3D:
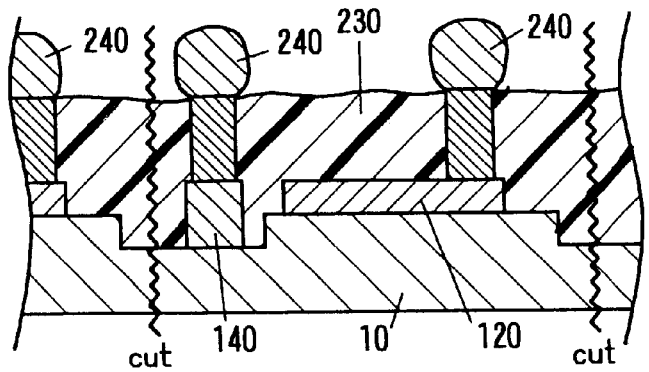

In this embodiment, in order to form a plating film 220, thick film resist 210 which functions as a mask in the first embodiment is used as a curable resin 230. The resin 230 shown in FIGS. 3A–3C is made of a photo-sensitive polyimide resin. The resin 230 is uniformly applied to the substrate 10, on which each layers and electrodes 120 and 140 are formed. The substrate is coated with the resin 230 by a spin-coating method. Then the resin 230 is baked at 180° C. for 30 min. until it becomes semihard. A positive photo-sensitive resist is coated and baked at 90° C. for 2 min. The resist is then exposed by light through a mask pattern. A developer is used to remove the exposed portion of the resin 230 which is made of photo-sensitive polyimide resin by etching. Photo-sensitive polyimide resin dissolves in alkaline solution when it senses light. Only the light-sensed portion of the resist and the resin is removed by using acetone or IPA. Then the rest of the polyimide resin is baked at 300° C. for 30 min., until it is completely cured. Accordingly, a plating film growth parts 211 is formed as shown in FIG. 3A. Then, as shown in FIG. 3B, a plating film (or pillar) 220 is formed by metal plating. And a solder bump 240 is formed by screen printing as shown in FIG. 3C. Then the same process as described in the first embodiment follows.

EXAMPLE 3

Figures 4A, 4B:
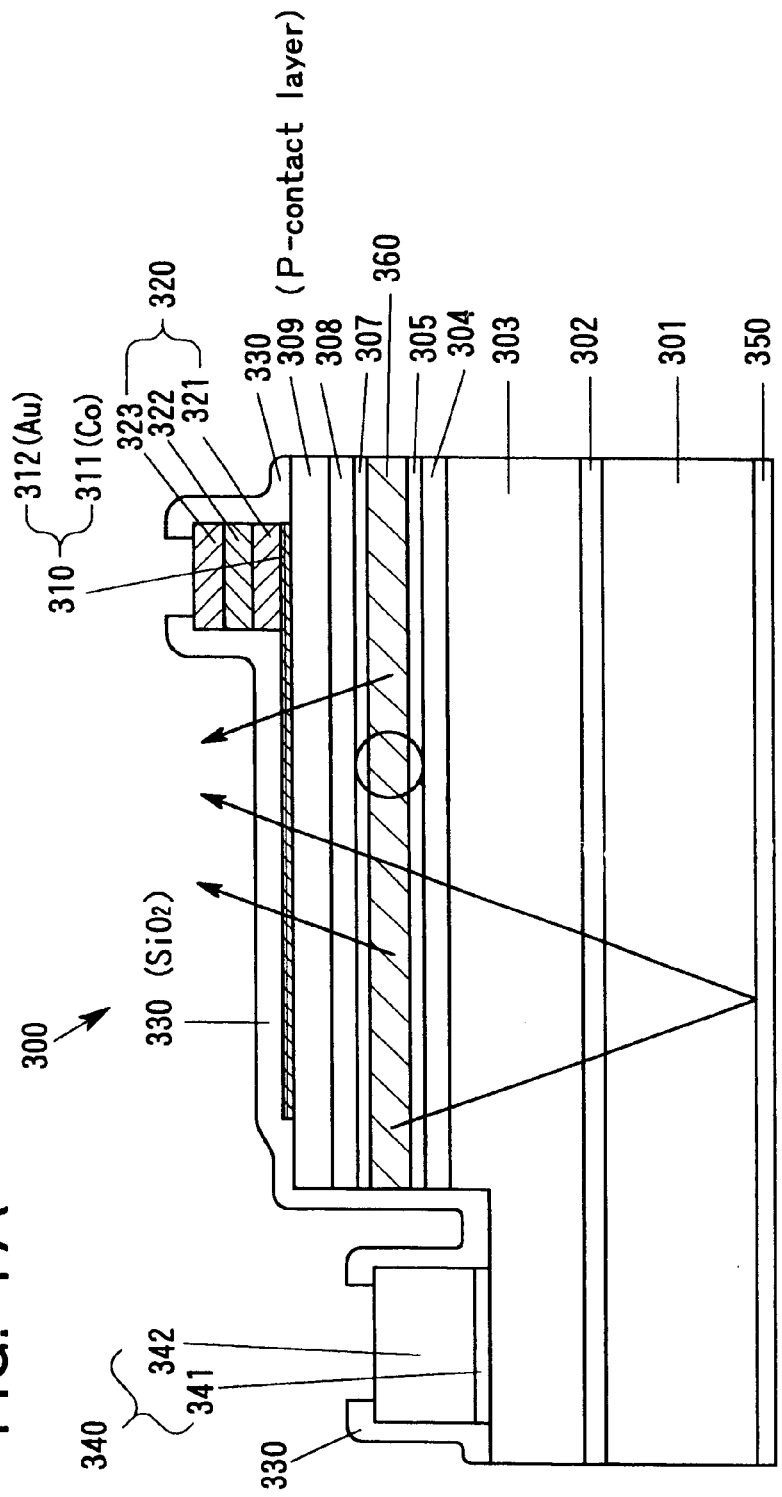
FIG. 4A is a sectional view of a wire-bonding-type of light-emitting semiconductor device in accordance with a third embodiment of this invention.
FIG. 4B is a sectional view of the MQW structure of FIG. 4A.

This embodiment focuses on a wire-bonding-type light-emitting device. FIGS. 4A and 4B illustrate a wire-bonding-type of light-emitting device 300. The device 300 comprises a sapphire substrate 301 having formed thereon a buffer layer 302 comprising aluminum nitride (AlN). In this embodiment, the buffer layer 302 has a thickness of about 200 Å. On the buffer layer 302 is disposed a silicon (Si) doped $n^+$-layer 303 comprising gallium nitride (GaN) and having a thickness of about 4.0 $\mu$m and a high carrier concentration successively thereon.

Formed on the silicon doped $n^+$-layer 303 is a non-doped middle layer 304 comprising $In_{0.03}Ga_{0.97}N$ and having a thickness about 2000 Å.

An n-type cladding layer 305 comprising GaN and having a thickness about 150 Å is formed on the middle layer 304. And a multi quantum-well (MQW) active layer 360, having a multi quantum-well (MQW) structure, in which three well layers 361 and two barrier layers 362 are formed alternately, is formed on the middle layer 305. The well layer 361 and the barrier layer 362 are made of $Ga_{0.8}In_{0.2}N$ and GaN, respectively, each having a thickness about 30 Å and 70 Å, respectively. As a result, five layers including two pairs of the well layer and the barrier layer are laminated in the MQW active layer 360 and becomes to have a thickness about 230 Å.

A GaN cap layer 307 and a $p-Al_{0.12}Ga_{0.88}N$ p-type cladding layer 308, each having a thickness of about 140 Å and 200 Å, respectively, are formed sequentially on the MQW active layer 360. And a $p-Al_{0.05}Ga_{0.95}N$ P-type contact layer 309, having a thickness of about 600 Å, is formed on the p-type cladding layer 308.

A light-transparent thin film positive electrode 310 is formed on the p-type contact layer 309 by metal deposit, and a negative electrode 340 is formed on the $n^+$-layer 303. The light-transparent thin film positive electrode 310 comprises a first thin film positive electrode 311, and a second thin film positive electrode 312. The first thin film positive electrode 311, made of cobalt (Co) and having a thickness of about 15 Å, contacts to the p-type contact layer 309, and the second thin film positive electrode 312, made of gold (Au) and having a thickness of about 60 Å, contacts to the Co.

A thick film positive electrode (pad) 320 comprises a first thick film positive electrode 321, a second thick film positive electrode 322, and a third thick film positive electrode 323, laminated sequentially on the light transparent thin film positive electrode 310. The first, second, and third thick film positive electrodes 321, 322, and 323 are made of vanadium (V), gold (Au), and aluminum (Al), respectively, and each has a thickness of about 175 Å, 15,000 Å, and 100 Å. A negative electrode (pad) 340 with a multi-layer structure comprises a vanadium (V) layer 341, which has a thickness of about 175 Å, and an aluminum (Al) layer 342, which has a thickness of about 1.8 $\mu$m, laminated sequentially on an exposed portion of the $n^+$-layer 303 of high carrier concentration.

And a protection layer 330 made of $SiO_2$ is formed on the upper surface of the device 300, and a metal reflecting layer 350 made of aluminum (Al), having a thickness of about 5000 Å, is formed to cover entire back of the substrate 301.

Figure 5A:
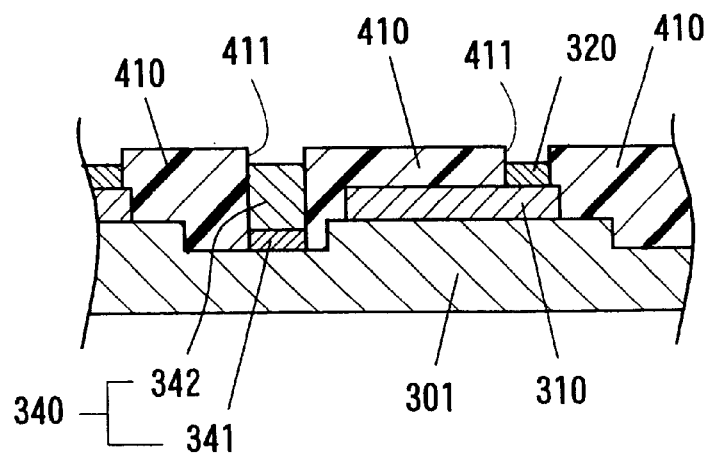
FIGS. 5A–5B are views sequentially showing the steps in which the wire-bonding-type light-emitting semiconductor device units of the third embodiment are sealed with resin and divided into separate devices.
Figure 5B:
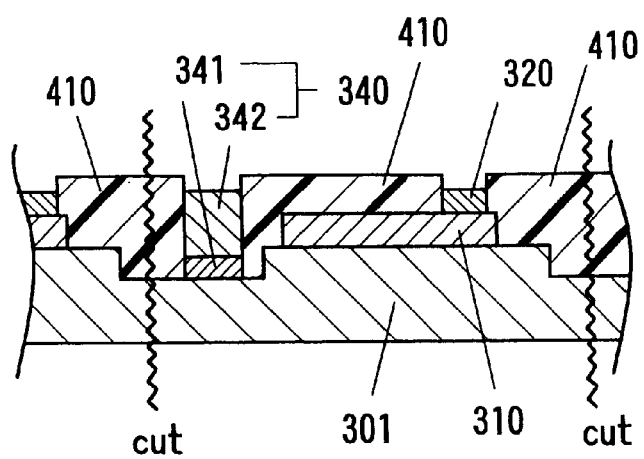

FIGS. 5A–5B illustrate process steps executed after forming the layers as described above on the common substrate 301. As shown in FIG. 5A, after a photo-sensitive resin 410 is coated uniformly on the substrate 301, windows 411 are formed on the pads 320 and 340. The windows 411 are used for a wire bonding to connect the exposed pads 320 and 340 and an external frame. After sealing the surface of the substrate 301 by resin, the wire bonding type device units 300 are then separated from each other by dividing the substrate 301 into distinct pieces as shown in FIG. 5B.

In this embodiment, a protection layer 330 is formed in the device 300. Alternatively, a protection layer 330 is not necessarily needed. The photo-sensitive resin 410 for sealing the substrate 301 can have the same function as the protection layer. In this embodiment, sealing by resin is carried out after forming pads 320 and 340. Alternatively, sealing by resin can be carried out before forming the pads 320 and 340, as shown in the first and the second embodiments. And forming process the pads 320 and 340 alternative to pillars 220 may follow as shown in FIGS. 2A–2D or in FIGS. 3A–3B. And also the resin can be used for both masking and sealing as in the second embodiment.

All of the illustrated embodiments depict the light-emitting device (LED) as the flip-chip-type semiconductor device 100 and the wire-bonding device 300. Alternatively, the method of this invention can be applied to various other types of semiconductor devices, including, for example, laser diodes, transistors such as FET, HEMT, diodes, and the like, in which Group III compound nitride semiconductor layers are laminated. Further, the present invention can be applied to semiconductor devices comprising materials other than Group III nitride compound semiconductors, so long as the alternative semiconductors have sufficient stability and durability to permit practice of this invention.

As described above, the composition and structure of each of the layers is characterized at their time of deposition. As would be understood by those skilled in the art, interfacial solid solutions or chemical compounds are formed between the layers by physical or chemical treatment, such as heat treatment, to obtain stronger adhesion or to lower contact resistivity.

In accordance with another modification to this invention, the depicted emission layer 104 may have a SQW (single-quantum well) structure or a homo-junction structure instead of a MQW (multi-quantum well) structure. Also, the Group III nitride compound semiconductor layer can be formed of one of a quaternary, ternary, and binary layer compound $Al_xGa_yIn_{1-x-y}N$ ($0 \leq x \leq 1$, $0 \leq y \leq 1$, $0 \leq x+y \leq 1$).

According to still another variation of this invention, the p-type impurity can be an element other than magnesium (Mg), such as beryllium (Be) or zinc (Zn). Further, a plurality of p-type impurities can be doped into the layer. Furthermore, the positive electrode 140 and the negative electrode 120 can be formed by other metals having different structures than those illustrated.

The foregoing detailed description of the preferred embodiments of the invention has been provided for the purpose of explaining the principles of the invention and its practical application, thereby enabling others skilled in the art to understand the invention for various embodiments and with various modifications as are suited to the particular use contemplated. The foregoing detailed description is not intended to be exhaustive or to limit the invention to the precise embodiments disclosed. Modifications and equivalents will be apparent to practitioners skilled in this art and are encompassed within the spirit and scope of the appended claims.

What is claimed is:

1. A sealed semiconductor device comprising:
    a semiconductor device unit having a Group III nitride compound semiconductor layer provided on a substrate, said semiconductor device unit comprising a positive electrode and a negative electrode;
    metal pillars formed on said positive electrode and said negative electrode; and
    a curable sealing resin laminated on a surface of said substrate on which said electrodes and metal pillars are formed so as to seal said electrodes and seal the metal pillars, said curable sealing resin having substantially the same height as said metal pillars,
    wherein the curable sealing resin has cut surfaces, each cut surface being located at an edge of the semiconductor device.

2. The device of claim 1, wherein said metal pillars are formed by metallic plating.

3. The device of claim 1, wherein said sealed semiconductor device constitutes a self-contained package which is electrically connectable to an external member.

4. The device of claim 1, wherein end portions of said metal pillars are exposed by the cured sealing resin and electrically connectable to an external member.

5. A device of claim 1, wherein said sealed semiconductor device is a flip-chip type light-emitting device.

6. A device of claim 1, wherein said sealed semiconductor device is a wire bonding type light-emitting device.

7. A sealed semiconductor device comprising:
    a semiconductor device unit having a Group III nitride compound semiconductor layer provided on a substrate, said semiconductor device unit comprising a positive electrode and a negative electrode;
    a first metal pillar formed on said positive electrode and a second metal pillar formed on said negative electrode; and
    a curable sealing resin laminated on a surface of said substrate on which said electrodes and metal pillars are formed so as to seal said positive and negative electrodes and the metal pillars, except for leaving exposed electrical connection portions of said first and second metal pillars, said curable sealing resin having substantially the same height as said metal pillars; and
    an external member electrically connected to the exposed electrical connection portions formed on said positive and negative electrodes;
    wherein the curable sealing resin has cut surfaces, each cut surface being located at an edge of the semiconductor device.

8. The device of claim 7, further comprising conductive bumps on said exposed electrical connection portions of the first and second pillars, respectively;
    wherein said external member is electrically connected to said positive and negative electrodes via said bumps and said first and second pillars.

9. The device of claim 7, wherein the metal pillars are formed by metallic plating.

10. The device of claim 7, wherein said individual sealed semiconductor device constitutes a self-contained package.

11. A sealed semiconductor device comprising:
    a semiconductor device unit having a Group III nitride compound semiconductor layer provided on a substrate, said semiconductor device unit comprising a positive electrode and a negative electrode;
    bonding pads formed on respective electrodes;
    a curable sealing resin laminated on a surface of said substrate on which said electrodes and bonding pads are formed so as to seal the electrodes and seal said bonding pads, said curable sealing resin having substantially the same height as said bonding pads, wherein the curable sealing resin has cut surfaces, each cut surface being located at an edge of the semiconductor device.

* * * * *